United States Patent [19]

Mukogawa

[11] Patent Number: 5,511,569
[45] Date of Patent: Apr. 30, 1996

[54] CLEANING APPARATUS

[75] Inventor: Yasukazu Mukogawa, Hyogo, Japan

[73] Assignee: Mitsubishi Denki Kabushiki Kaisha, Tokyo, Japan

[21] Appl. No.: 160,753

[22] Filed: Dec. 3, 1993

[30] Foreign Application Priority Data

Jul. 20, 1993 [JP] Japan .................................. 5-179097

[51] Int. Cl.$^6$ ..................................................... B08B 3/02
[52] U.S. Cl. ........................ 134/104.1; 134/112; 134/95.3; 134/155; 134/902
[58] Field of Search ................................. 134/902, 56 R, 134/58 R, 155, 186, 100.1, 112, 95.3, 104.1; 68/12.02; 118/70; 154/389

[56] References Cited

U.S. PATENT DOCUMENTS

| | | | |
|---|---|---|---|
| 5,027,841 | 7/1991 | Breunsbach et al. | 134/95.3 |
| 5,100,544 | 3/1992 | Izutani et al. | |
| 5,141,009 | 8/1992 | Morantz | 134/104.1 |
| 5,180,431 | 1/1993 | Sugimoto | 134/104.1 |
| 5,232,476 | 8/1993 | Grant. | |
| 5,279,926 | 1/1994 | Chandler et al. | 134/902 |
| 5,368,651 | 11/1994 | Esser | 134/104.1 |

FOREIGN PATENT DOCUMENTS

| | | | |
|---|---|---|---|
| 60-139291 | 7/1985 | Japan | 68/12.02 |
| 61-61425A2 | 3/1986 | Japan. | |
| 61-232895 | 10/1986 | Japan | 68/12.02 |
| 1-260823 | 10/1989 | Japan | 134/902 |
| 2-26028A2 | 1/1990 | Japan. | |
| 2-285635A2 | 11/1990 | Japan. | |
| 3-116728A2 | 5/1991 | Japan. | |
| 3-283536A2 | 12/1991 | Japan. | |
| 4-88651 | 3/1992 | Japan | 134/902 |
| 4-124825 | 4/1992 | Japan | 134/902 |
| 4-259222A2 | 9/1992 | Japan. | |
| 4-302144 | 10/1992 | Japan | 134/902 |
| 4-302145 | 10/1992 | Japan | 134/902 |

OTHER PUBLICATIONS

"The Measurement of Particles in Circulating Filter System", Mili–Pore News No. 01, 1989.6.
"Cleaning and Wet Etching", Semiconductor World 1986.9.
Römpps Chemisches Wörterbuch, Franckh'sche Verlagshandlung, W. Keller & Co., Stuttgart, 1969, p. 582.

Primary Examiner—Frankie L. Stinson
Attorney, Agent, or Firm—Lowe, Price, LeBlanc & Becker

[57] ABSTRACT

An improved cleaning apparatus preventing new cleaning chemicals form contamination at the time of exchanging used cleaning chemicals with the new chemicals is provided. The apparatus includes a cleaning chemicals tank storing new chemicals and a cleaning vessel. A first cleaning chemicals supply conduit supplying new chemicals from tank into vessel is coupled to cleaning chemicals tank. A waste fluid conduit externally discharging used cleaning chemicals is provided at the bottom of vessel. Vessel is provided with wetting agent supply means supplying a wetting agent to wet the inner wall surface 8a of vessel.

12 Claims, 9 Drawing Sheets

CLEANING APPARATUS

BACKGROUND OF THE INVENTION

1. Field of the Invention

The present invention relates generally to cleaning apparatuses, and more specifically, to a cleaning apparatus for cleaning semiconductor wafers with cleaning chemicals.

2. Description of the Background Art

Various steps (such as removal of native oxide films and formation of contact holes) are involved in treating the surface of a semiconductor wafer (hereinafter simply referred to as wafer) in the manufacture of a semiconductor device.

Referring to FIG. 9, a surface-treated wafer 100 is placed in a basket 101, sent together with basket 101 into a cleaning vessel 2 filled with chemicals and cleaned. Then, wafer 100 is sent to water tanks 102 and 103 filled with water and washed with the water. The washed wafer is sent to a drying chamber 104 and dried.

FIG. 10 is a view showing the concept of a conventional wafer cleaning apparatus. The conventional cleaning apparatus includes a cleaning chemicals tank 1 storing cleaning chemicals. $NH_3+H_2O_2$, $HCl+H_2O_2$, HF or the like is used for such cleaning chemicals. A cleaning vessel 2 accommodates the cleaning chemicals supplied from cleaning chemicals tank 1. New cleaning chemicals is supplied into cleaning vessel 2 from cleaning chemicals tank 1 through a cleaning chemicals supply conduit 3. A supply valve 4 is provided in cleaning chemicals supply conduit 3 for regulating the amount of cleaning chemicals flowing in cleaning vessel supply conduit 3. A conduit for waste fluid 5 for externally discharging used cleaning chemicals is connected to the bottom of cleaning vessel 2. Conduit for waste fluid 5 is provided with a waste fluid valve 6 for regulating the amount of used cleaning chemicals flowing in waste fluid conduit 5. The cleaning chemicals in cleaning vessel 2 is circulated by a pump 48. Foreign matters in the chemicals are removed away by a filter 49 during the circulation.

Cleaning vessel 2 must have resistance to chemicals and heat, strength and the like. Cleaning vessel 2 is therefore formed of a teflon based material (such as PTFE and PFA), SUS, silica, glass or the like. When acidic or alkaline chemicals is used for the cleaning chemicals, cleaning vessel 2 is mostly formed of a teflon based material. The cleaning vessel is sometimes partially formed of silica or glass in such a case, but it is undesirable to use such a fragile material which might crack. The above-described teflon based material is hydrophobic, in other words does not unite with water.

Now, a cleaning operation will be described.

By closing waste fluid valve 6 and opening supply valve 4, new cleaning chemicals is introduced from cleaning chemicals tank 1 into cleaning vessel 2. About 30 liter of cleaning chemicals is accommodated in cleaning vessel 2. About 25 wafers are introduced into cleaning vessel 2 and cleaned. Organic substances, foreign matters, metals, etc. sticking to the surfaces of the wafers are removed away by the cleaning.

The cleaning process is completed by taking out the wafers from cleaning vessel 2.

When such a cleaning process is repeated a number of times, the cleaning chemicals in cleaning vessel 2 is contaminated, and therefore, the chemicals must be exchanged. The present invention relates to exchanging the cleaning chemicals.

First how cleaning chemicals is exchanged in a conventional cleaning vessel will be described.

Supply valve 4 is closed, and waste fluid valve 6 is opened. Used cleaning chemicals is discharged from vellel 2 through waste fluid conduit 5. When the used cleaning chemicals is entirely discharged from cleaning vessel 2, waste fluid valve 6 is closed and supply valve 4 is opened. New cleaning chemicals is guided into cleaning vessel 2 through cleaning chemicals supply conduit 3, thus completing the operation of exchanging the cleaning chemicals.

The conventional exchanging operation for cleaning chemicals in the cleaning vessel was very simple as described above. The conventional cleaning vessel is however disadvantageous when particles about as large as 0.1 µm in size present in cleaning chemicals are addressed. More specifically, in a cleaning vessel for semiconductor wafer, particles contained in used cleaning chemicals stick to the inner surface of cleaning vessel 2 at the time of exchanging the cleaning chemicals, or foreign matters may be produced from the inner surface of cleaning vessel 2 itself when it dries. Since a teflon based material is hydrophobic, and therefore foreign matters are more likely to be produced when the wall face dries. As a result, even if new cleaning chemicals without any such particles is supplied into cleaning vessel 2, particles already sticking to the inner surface of cleaning vessel 2 or foreign matters produced from the inner wall surface itself is taken into the new cleaning chemicals, resulting in contamination of the new cleaning chemicals. Such a problem is hardly recognized when foreign matters about as large as 0.3 µm in particle size are objects to be removed, but it cannot be ignored when foreign matters about as large as 0.1 µm must be removed.

FIG. 11 is a graph showing a result of measurement of the number of foreign matters in cleaning chemicals immediately after and before exchange. The same test was conducted twice (Sample 1 and Sample 2). FIG. 12 is a chart showing the relation between time passed from immediately after exchange of the cleaning chemicals and the number of foreign matters. Referring to these figures, the number of foreign matters in the cleaning chemicals immediately before exchange is smaller than the number of foreign matters in the cleaning chemicals immediately after exchange, because before exchanging the cleaning chemicals, the cleaning chemicals is filtered and circulated during cleaning. The cleaning chemicals immediately after exchange contains more foreign matters, because particles stick to the inner wall surface of the cleaning vessel or the inner wall surface of the cleaning vessel dries to produce foreign matters as described above, and they are mixed into new cleaning chemicals.

One method of reducing foreign matters in cleaning chemicals immediately after exchanging cleaning chemicals is to once fill cleaning vessel 2 with new cleaning chemicals, then discharge the chemicals, and once again introduce new cleaning chemicals into cleaning vessel 2, but this method disadvantageously uses a large amount of chemicals.

SUMMARY OF THE INVENTION

The present invention is directed to a solution to the above-described problem, and it is an object of the invention to provide an improved cleaning apparatus preventing new cleaning chemicals from being contaminated when used cleaning chemicals is exchanged with the new cleaning chemicals.

Another object of the invention is to provide an improved cleaning apparatus preventing particles about as large as 0.1

μm in size from being mixed into new cleaning chemicals when used cleaning chemicals is exchanged with the new cleaning chemicals.

A cleaning apparatus according to a first aspect of the invention concerns a cleaning apparatus cleaning a semiconductor wafer with cleaning chemicals. The cleaning apparatus includes a cleaning vessel for accommodating cleaning chemicals supplied from a cleaning chemicals tank. A waste fluid conduit for externally discharging the cleaning chemicals is provided at the bottom of the cleaning vessel. The apparatus includes a wetting agent supply means for supplying a wetting agent for wetting the inner wall surface of the cleaning vessel when the cleaning chemicals is discharged through the waste fluid conduit.

A cleaning apparatus according to a second aspect of the invention concerns a cleaning apparatus cleaning a semiconductor wafer with cleaning chemicals. The cleaning apparatus includes a cleaning vessel for accommodating cleaning chemicals supplied from a cleaning chemicals tank. The cleaning vessel includes (a) a bottom wall member, (b) a first tubular surrounding member provided on the bottom wall member and forming an accommodation chamber for accommodating the cleaning chemicals, (c) a second tubular surrounding member provided on the bottom wall member and surrounding the first tubular surrounding member from the outside at a distance apart so as to form a first space, and (d) a third tubular surrounding member provided on the bottom wall member and surrounding the second tubular surrounding member from the outside at a distance apart so as to form a second space. The height of the second tubular surrounding member is set higher than the height of the first tubular surrounding member. The apparatus further includes a cleaning chemicals supply conduit coupled to the cleaning chemicals tank for supplying cleaning chemicals into the accommodation chamber, and a second cleaning chemicals supply conduit for supplying the cleaning chemicals up from the bottom to the first space. The apparatus further includes a first waste fluid conduit coupled to the bottom wall member for discharging waste fluid from the accommodation chamber, and a second waste fluid conduit connected to the bottom wall member for discharging cleaning chemicals from the second space.

In the cleaning apparatus according to the first aspect of the invention, since the wetting agent supply portion for supplying a wetting agent wetting the inner surface of the cleaning vessel when waste fluid is discharged into the discharge conduit is provided, the inner wall surface of the cleaning vessel never dries when the cleaning chemicals is exchanged. As a result, foreign matters are not generated from the inner surface of the cleaning vessel. Furthermore, foreign matters sticking to the inner wall surface of the cleaning vessel are washed away with the wetting agent.

In the cleaning apparatus according to the second aspect of the invention, at the time of exchanging the cleaning chemicals, excess cleaning chemicals after filling the first space overflows and wets the inner wall surface of the first tubular surrounding member. Therefore, at the time of exchanging the cleaning chemicals, the inner wall surface of the first tubular surrounding member forming the accommodation chamber never dries. As a result, foreign matters are not produced from the inner wall surface of the accommodation chamber. Foreign matters sticking to the inner wall surface are washed off with the cleaning chemicals.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, embodiments of the invention will be described in conjunction with the drawings.

EMBODIMENT 1

Figure 1:
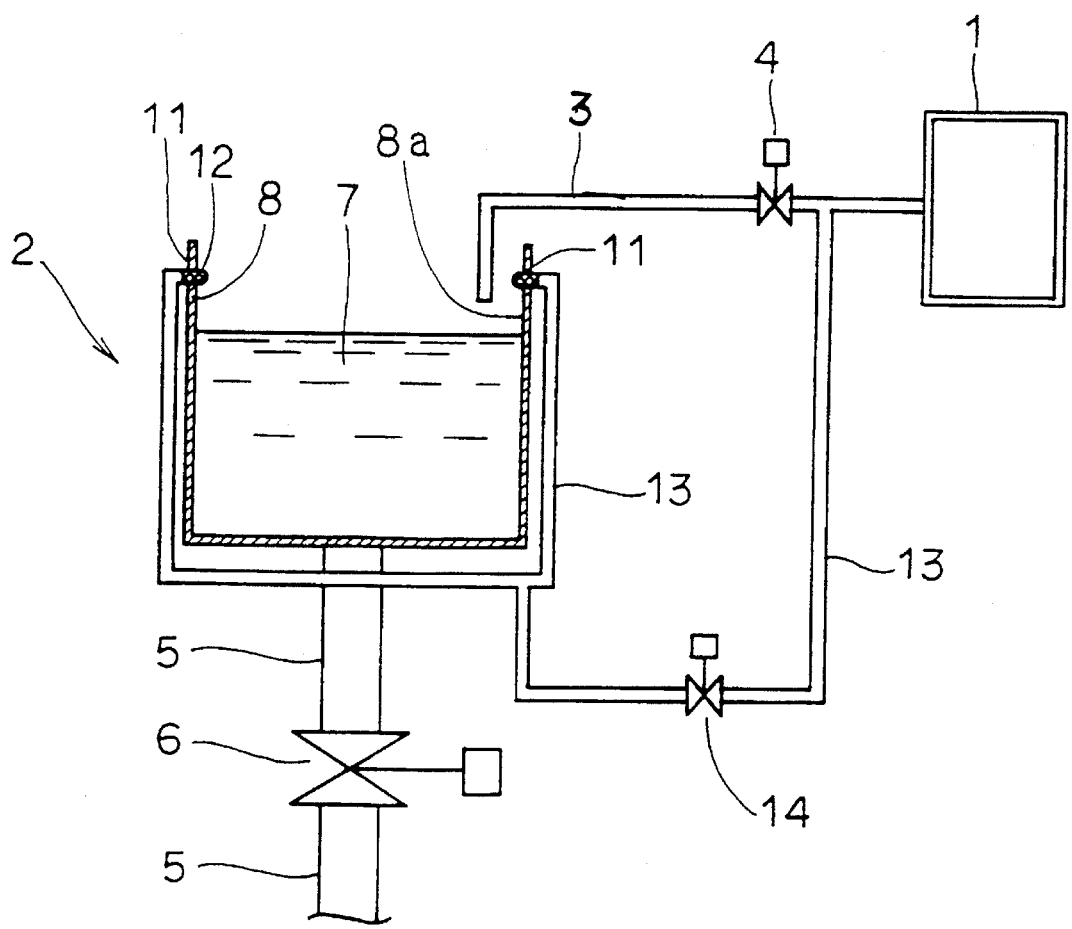
FIG. 1 is a view showing the concept of a cleaning apparatus according to a first embodiment of the invention.

FIG. 1 is a view showing the concept of a cleaning apparatus according to EMBODIMENT 1. The apparatus includes a cleaning chemicals tank 1 storing new cleaning chemicals, and a cleaning vessel 2 for accommodating cleaning chemicals supplied from cleaning chemicals tank 1. Cleaning vessel 2 includes a cleaning container 8 for accommodating cleaning chemicals. A number of throughholes 11 are provided in and at the upper part of the inner wall surface 8a of the cleaning container. A nozzle 12 supplying cleaning chemicals to the inner wall surface 8a of cleaning container 8 is provided in through hole 11. Cleaning container 8 is provided with a second cleaning chemicals supply conduit 13 guiding cleaning chemicals from cleaning chemicals tank 1 to nozzle 12.

Cleaning chemicals tank 1 is coupled with a first cleaning chemicals supply conduit 3 supplying new cleaning chemicals into cleaning container 8 from cleaning chemicals tank 1. A waste fluid conduit 5 for externally discharging used cleaning chemicals is provided at bottom of cleaning container 8. A first supply valve 4 is provided at first cleaning chemicals supply conduit 3. A second supply valve 14 is provided at second cleaning chemicals supply conduit 13. Waste fluid conduit 5 is provided with a waste fluid valve 6.

Opening/closing of these valves is preferably electrically conducted.

Cleaning chemicals degrade when used for a long period of time, and therefore must be exchanged with new cleaning chemicals.

Now, an operation of exchanging cleaning chemicals will be described.

Used cleaning chemicals 7 before exchanged is accommodated in cleaning container 8. Waste fluid valve 6 provided in waste fluid conduit 5 is opened, and used cleaning chemicals 7 is externally discharged through waste fluid conduit 5 by gravity. Simultaneously with or somewhat earlier than the opening of waste fluid valve 6, second supply valve 14 for second cleaning chemicals supply conduit 13 is opened. Thus, new cleaning chemicals flows along the inner wall surface 8a of cleaning container 8 from nozzle 12 provided at one end of second cleaning chemicals supply conduit 13, and the inner wall surface 8a of cleaning container 8 is always wetted and washed. Note that supply valve 4 for first cleaning chemicals supply conduit 3 is closed at the time. After the used cleaning chemicals 7 in cleaning container 8 is entirely discharged, waste fluid valve 6 for waste fluid conduit 5 is closed in the meantime.

Then, first supply valve 4 for first cleaning chemicals supply conduit 3 is opened, and new cleaning chemicals is supplied into cleaning container 8. At the time, first supply valve 4 and second supply valve 14 are opened. When cleaning container 8 is filled with new cleaning chemicals, first supply valve 4 and second supply valve 14 are closed, thus completing the exchange of cleaning chemicals. According to the cleaning apparatus of EMBODIMENT 1, the number of foreign matters in new cleaning chemicals can be reduced as much as possible. The apparatus is particularly effective in reducing the number of foreign matters about as large as 0.1 μm in size.

EMBODIMENT 2

Figure 2:
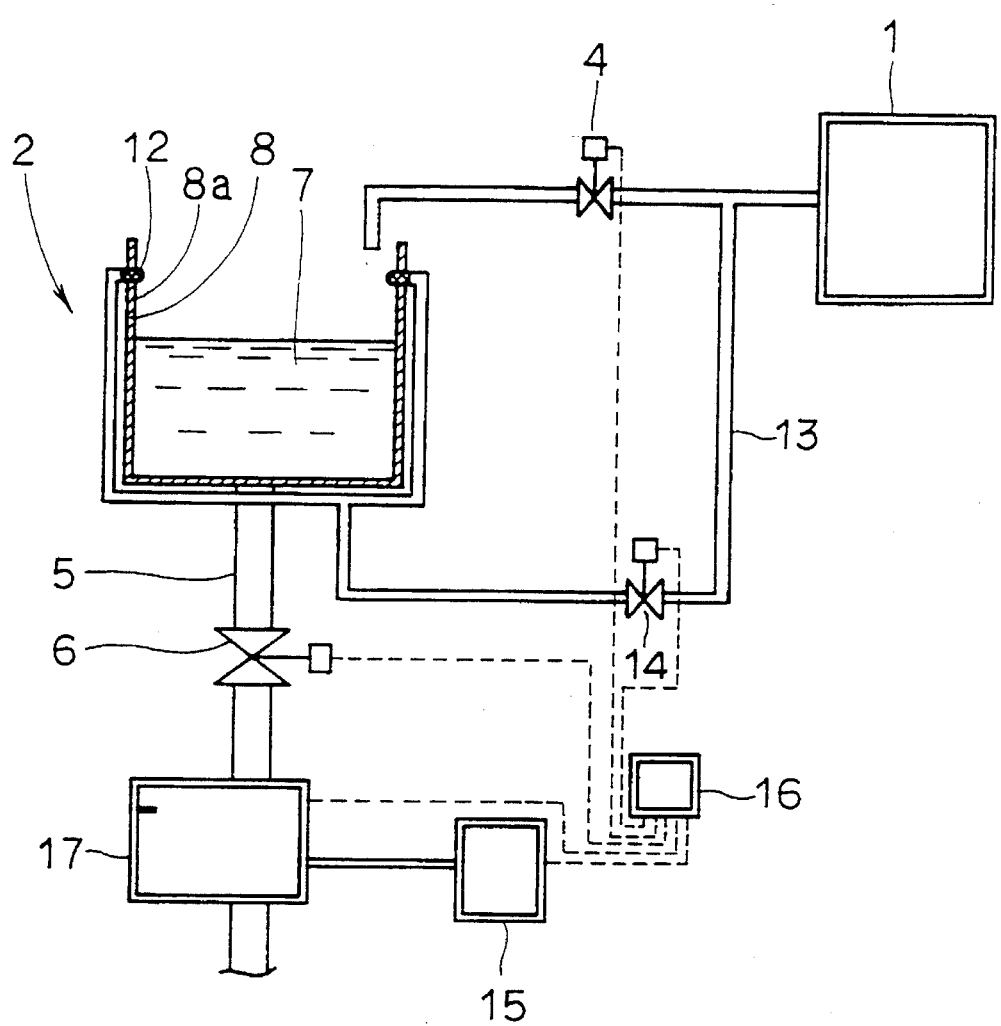
FIG. 2 is a view showing the concept of a cleaning apparatus according to a second embodiment of the invention.

FIG. 2 is a view showing the concept of a cleaning apparatus according to EMBODIMENT 1. Since cleaning apparatus shown in FIG. 2 is identical to the cleaning apparatus according to EMBODIMENT 1 with the following difference, the portions the same as or corresponding to those in EMBODIMENT 1 are designated with the same reference numerals and the description thereof will not be repeated.

The apparatus shown in FIG. 2 is essentially different from the apparatus shown in FIG. 1 in that a particle counter 15 for counting the number of foreign matters in used cleaning chemicals flowing through waste fluid conduit 5, and a feedback control means 16 for constantly monitoring foreign matters contained in used cleaning chemicals, thereby permitting appropriate exchange of cleaning chemicals are provided. The apparatus in EMBODIMENT 2 further includes a buffer tank 17 provided in waste fluid conduit 5 for removing bubbles taken into used cleaning chemicals at the time of discharging the used cleaning chemicals.

Particle counter 15 is coupled with buffer tank 17. Feedback control means 16 communicates with particle counter 15, buffer tank 17, waste fluid valve 6, first supply valve 4 and second supply valve 14.

The structure of buffer tank 17 will be described further in detail in conjunction with FIGS. 2 and 3.

Figure 3:
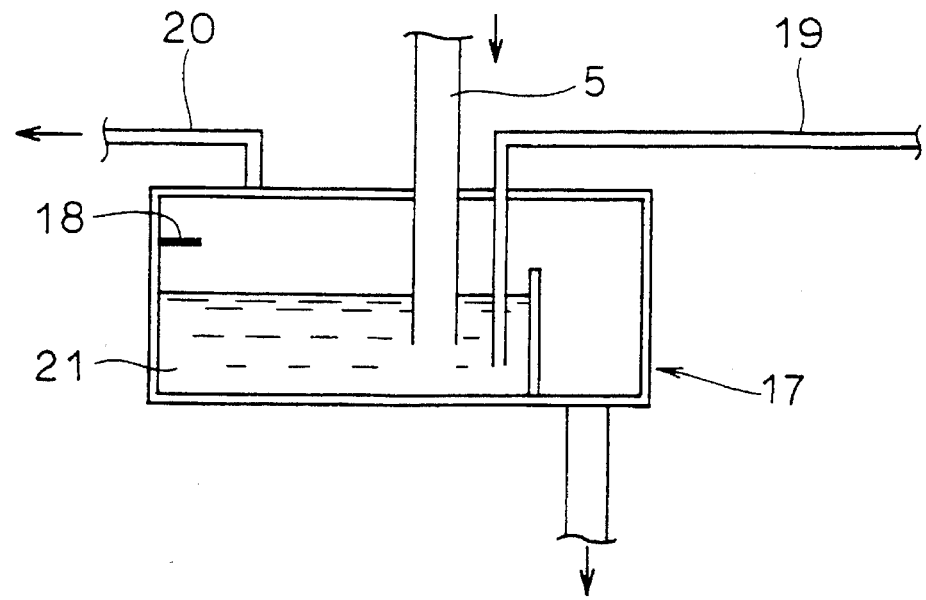
FIG. 3 is a view showing in detail a buffer tank.

Referring to FIG. 3, buffer tank 17 includes a liquid-level sensor 18, a waste fluid conduit 5, a line 19 for guiding used cleaning chemicals to a particle counter (not shown), and a pressure reduced line 20 for placing buffer tank 17 under reduced pressure. Although not shown, liquid-level sensor 18 is communicated with the above-described feedback control means 16.

Bubbles in the used cleaning chemicals coming into buffer tank 17 through waste fluid conduit 5 is removed away by pressure reducing line 20. The used cleaning chemicals removed of bubbles is guided to particle counter 15 through line 19. Since the used cleaning chemicals guided to particle counter 15 does not contain bubbles, and therefore the number of foreign matters can be measured accurately.

Figure 4:
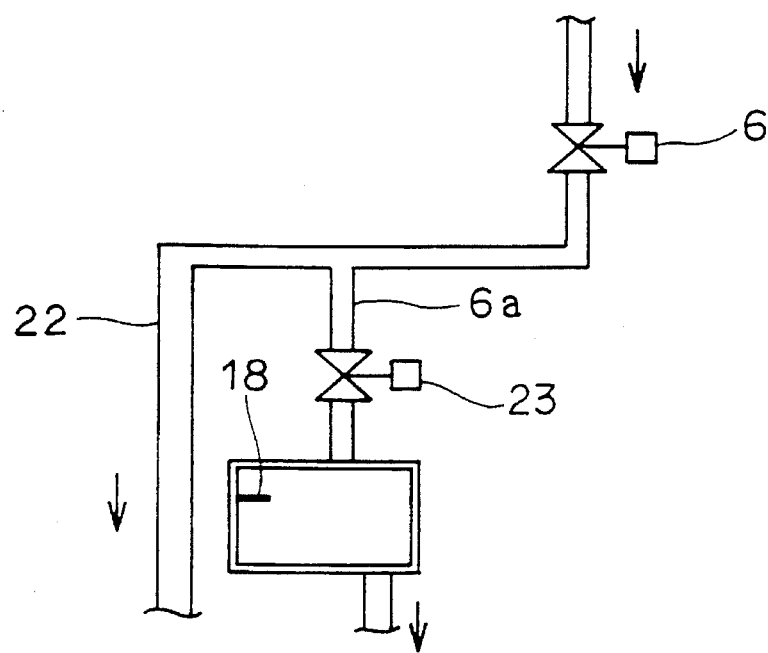
FIG. 4 is a view showing a variation of the second embodiment.

Operation of the buffer tank shown in FIG. 3 will be described. When cleaning chemicals 21 in buffer tank 17 reaches liquid-level sensor 18, waste fluid valve 6 for waste fluid conduit 5 is closed. When the cleaning chemicals no longer reaches liquid-level sensor 18, waste fluid valve 6 is opened. Use of the buffer tank shown in FIG. 3 however suffers from too long a period of time for discharging the chemicals. It is preferable to provide a bypass conduit 22 and a further waste fluid valve 23 as illustrated in FIG. 4, if this causes a significant problem. In such arrangement, waste fluid valve 6 is always opened, and waste fluid valve 23 communicates with liquid-level sensor 18. More specifically, when used chemicals reaches liquid-level sensor 18, waste fluid valve 23 is closed, while when the used cleaning chemicals no longer reaches liquid-level sensor 18, waste fluid valve 23 is opened.

Referring to FIG. 2, an operation of exchanging cleaning chemicals in the cleaning apparatus according to EMBODIMENT 2 will be described. Waste fluid valve 6 for waste fluid conduit 5 and the second supply valve for second cleaning chemicals supply conduit 13 are opened to discharge cleaning chemicals from cleaning vessel 2. This discharging operation enables the used cleaning chemicals to be introduced into buffer tank 17 incorporated in the path of waste fluid conduit 5.

The used cleaning chemicals is sent from buffer tank 17 to particle counter 15, and the number of particles in the used cleaning chemicals (including the used cleaning chemicals and new cleaning chemicals supplied to inner wall surface 8a from nozzle 12) is counted. The above-described operation is sequentially conducted. Even if the used cleaning chemicals in cleaning vessel 2 is entirely discharged, new cleaning chemicals continues to be supplied to the inner wall surface 8a of cleaning container 8 from second cleaning chemicals supply conduit 13 through nozzle 12. The number of particles in this new cleaning chemicals is counted at particle counter 15. The number of particles in cleaning chemicals can be detected during cleaning the wafer.

When the count value of particles detected by particle counter 15 becomes smaller than a fixed value, first supply valve 4 for first cleaning chemicals supply conduit 3 is opened, waste fluid valve 6 for waste fluid conduit 5 is closed, and thus new cleaning chemicals is stored in cleaning container 8. When cleaning container 8 is filled with new cleaning chemicals, first supply valve 4 and second supply valve 14 are closed, thus completing the exchanging operation for the cleaning chemicals. First supply valve 4, second supply valve 14, waste fluid valve 6, liquid-level sensor 18, and particle counter 15 operate under the control of feedback control means 16.

In this apparatus, if the value of particle counter 15 does not decrease after passage of a fixed time period, an alarm will be given. When the number of particles is below a fixed value, the preparation for cleaning is completed.

EMBODIMENT 3

Figure 5:
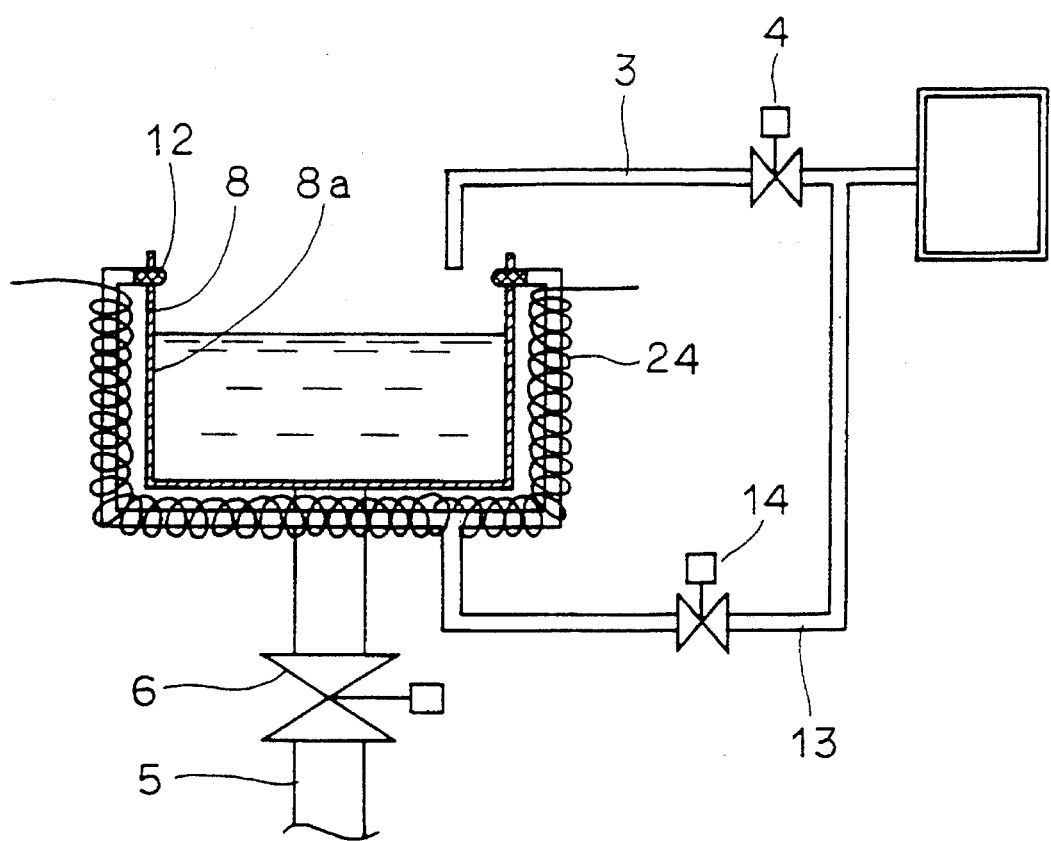
FIG. 5 is a view showing the concept of a cleaning apparatus according to a third embodiment of the invention.

FIG. 5 is a view showing the concept of a cleaning apparatus according to EMBODIMENT 3. In EMBODIMENT 3, heating means 24 for heating cleaning chemicals flowing in second cleaning chemicals supply conduit 13 is provided. A heater may be used for heating means 24, but preferably a heat exchanger using high temperature water or high temperature vapor is used. Raising the temperature of cleaning chemicals in second cleaning chemicals supply conduit 13 further increases the effect of cleaning the inner wall surface 8a of cleaning container 8.

In FIG. 5, the same or corresponding portions to inner in EMBODIMENT 1 are designated with the same reference numerals and the description thereof will not be repeated here.

EMBODIMENT 4

Figure 6:
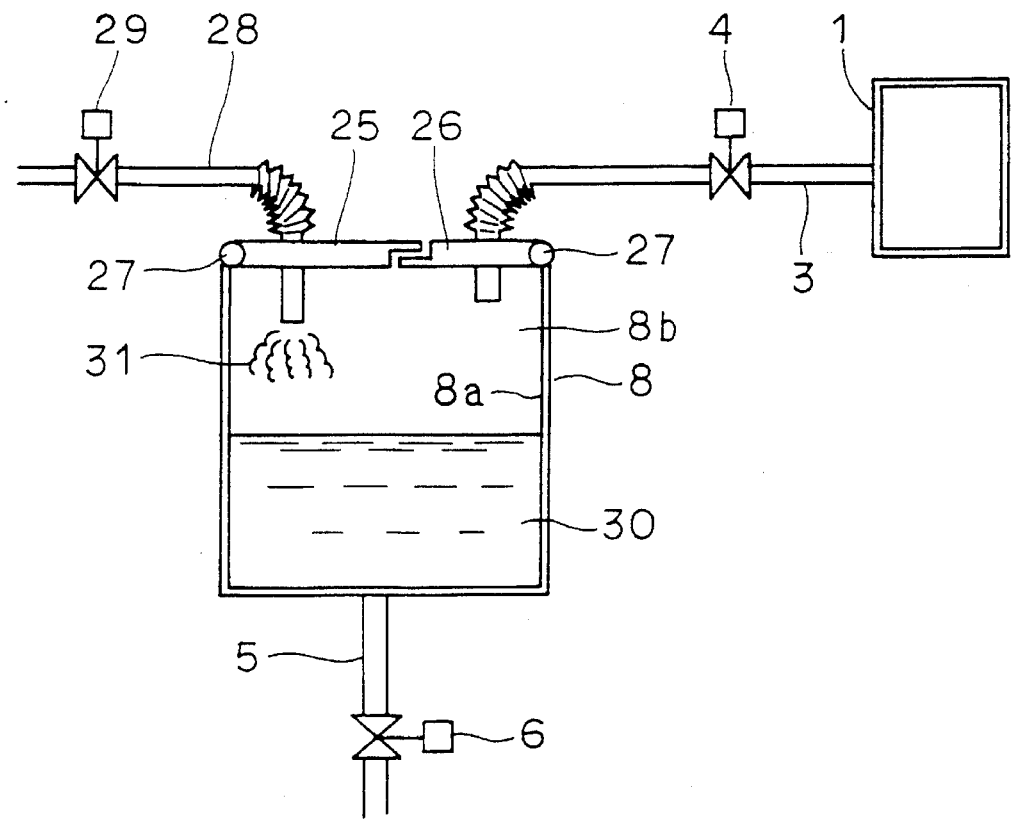
FIG. 6 is a view showing the concept of a cleaning apparatus according to a fourth embodiment of the invention.

FIG. 6 is a view showing the concept of a cleaning apparatus according to EMBODIMENT 4. The cleaning apparatus according to EMBODIMENT 4 includes a cleaning chemicals tank 1 storing new cleaning chemicals, and a cleaning container 8. Waste fluid conduit 5 is provided with a waste fluid valve 6. First and second lids 25 and 26 which open together upwardly are provided on the top of cleaning container 8. Opening/closing of first and second lids 25 and 26 is performed by a driving portion 27. First lid 25 is provided with a vapor supply line 28 for guiding vapor into cleaning container 8. Vapor supply line 28 is provided with a vapor valve 29. Second lid 26 is provided with a first cleaning chemicals supply conduit 3 guiding new cleaning chemicals into cleaning container 8 from cleaning chemicals tank 1. First cleaning chemicals supply conduit 3 is provided with a first supply valve 4.

Now, an exchange operation for cleaning chemicals will be described. Used cleaning chemicals 30 before exchange fills in cleaning container 8. Driving portion 27 is operated to close first lid 25 and second 26. Then, the vapor valve 29 of vapor supply line 28 is opened, and vapor 31 of heated pure water is supplied to a space 8b in cleaning container 8. The inner wall surface of cleaning container 8 is wetted with vapor 31.

Then, waste fluid valve 6 for waste fluid conduit 5 is opened to start discharging the used cleaning chemicals. During the period, first and second lids 25 and 26 are closed, and vapor 31 continues to be supplied into cleaning container 8. Accordingly, during discharging the used cleaning chemicals, the inner wall surface 8a of cleaning container 8 continues to be wetted. When the discharging of the used cleaning chemicals is completed, waste fluid valve 6 is automatically closed. Then, first supply valve 4 for first cleaning chemicals supply conduit 3 is opened to supply new cleaning chemicals, and new cleaning chemicals is supplied into cleaning container 8. During the period when the new cleaning chemicals is supplied into cleaning container 8, vapor 31 continues to be supplied into cleaning container 8. When the new cleaning chemicals fills cleaning container 8, vapor valve 29 is closed, thus completing supply of vapor 31. The above-described operation completes the exchanging operation for the cleaning chemicals, and a treatment of cleaning a semiconductor wafer is permitted. Thus, in the cleaning apparatus according to EMBODIMENT 4, since the inner wall surface of cleaning container 8 is always wetted with vapor, foreign matters are restrained from being produced.

EMBODIMENT 5

Figure 7:
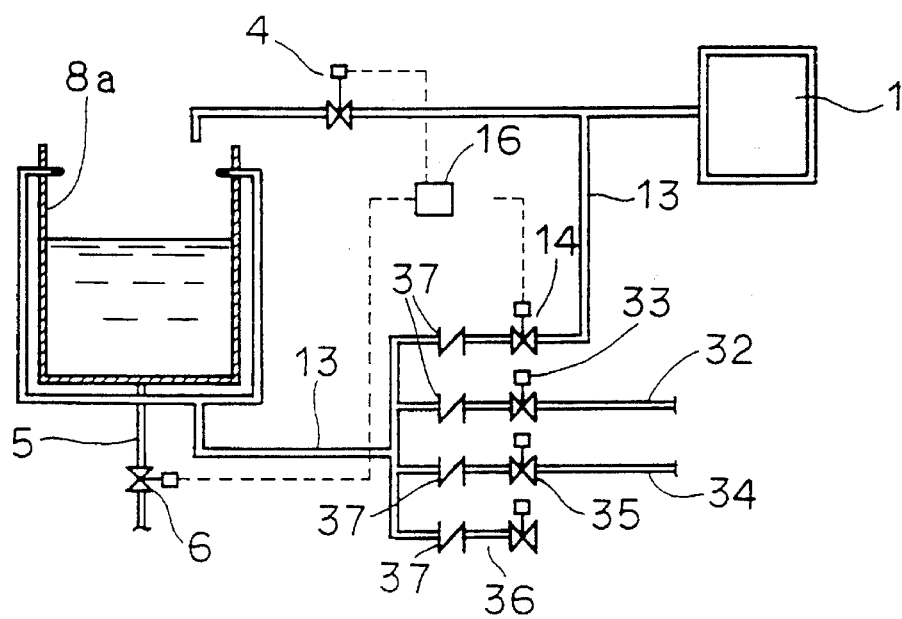
FIG. 7 is a view showing the concept of a cleaning apparatus according to a fifth embodiment of the invention.

FIG. 7 is a view showing the concept of a cleaning apparatus according to EMBODIMENT 5. Since the cleaning apparatus according to EMBODIMENT 5 is substantially identical to the cleaning apparatus according to EMBODIMENT 1 with the following difference, the same or corresponding portions are designated with the same reference numerals, and the description thereof will not be repeated here.

Now, the difference will be described.

Second cleaning chemicals supply conduit 13 is connected to a ultra pure water supply conduit 32 for supplying ultra pure water into second cleaning chemicals supply conduit 13. Ultra pure water supply conduit 32 is provided with an ultra pure supply valve 33. Second cleaning chemicals supply conduit 13 is connected to a hydrogen peroxide supply conduit 34 for supplying hydrogen peroxide into the second cleaning chemicals supply conduit. Hydrogen peroxide supply conduit 34 is provided with a hydrogen peroxide supply valve 35. Second cleaning chemicals supply conduit 13 is further provided with an auxiliary conduit 36. Second cleaning chemicals supply conduit 13, ultra pure water supply water conduit 32, hydrogen peroxide supply conduit 34, and auxiliary conduit 36 are each provided with a non-return valve 37. First supply valve 4, second supply valve 14 and waste fluid valve 6 are communicated with feedback control means 16.

Now, an exchanging operation for cleaning chemicals will be described. The operation is basically the same as EMBODIMENT 1, but in the present embodiment, chemicals to be supplied to the inner wall surface 8a of cleaning container 8 is selected from various kinds.

Simultaneously with or somewhat earlier than opening of waste fluid valve 6 for waste fluid conduit 5, second supply valve 14 for second cleaning chemicals supply conduit 13 is opened. Cleaning chemicals the same as the one used in cleaning vessel 2 flows through second cleaning chemicals supply conduit 13. For a fixed time period, the cleaning chemicals is supplied to the inner wall surface 8a of cleaning container 8 to wet the inner wall surface 8a of cleaning container 8, then second supply valve 14 is closed, and ultra pure water supply valve 33 for ultra pure water supply conduit 32 is opened. Ultra pure water thus flows through ultra pure water supply conduit.

After the ultra pure water is supplied to the inner wall surface 8a of cleaning container 8 for a fixed time period, ultra pure water supply valve 33 is closed, and hydrogen peroxide supply valve 35 for hydrogen peroxide supply conduit 37 is opened. Several % hydrogen peroxide flows through hydrogen peroxide supply conduit 34. After hydrogen peroxide is supplied to the inner wall surface 8a of cleaning container 8 for a fixed time period, hydrogen peroxide supply valve 35 is closed, ultra pure water supply valve 33 is opened, and ultra pure water is supplied to inner wall surface 8a. After the ultra pure water is supplied for a fixed time period, ultra pure water supply valve 33 is closed, second supply valve 14 is opened, and cleaning chemicals the same as the one used in the cleaning vessel is supplied to the inner wall surface 8a of cleaning container 8.

Thus supplying a plurality of kinds of chemicals and ultra pure water to the inner wall surface 8a of cleaning container 8 increases the effect of cleaning the inner wall surface 8a of cleaning container 8, thus reducing the number of particles. Note that combination of chemicals for supply and the order of cleaning may arbitrarily be selected.

EMBODIMENT 6

Figure 8:
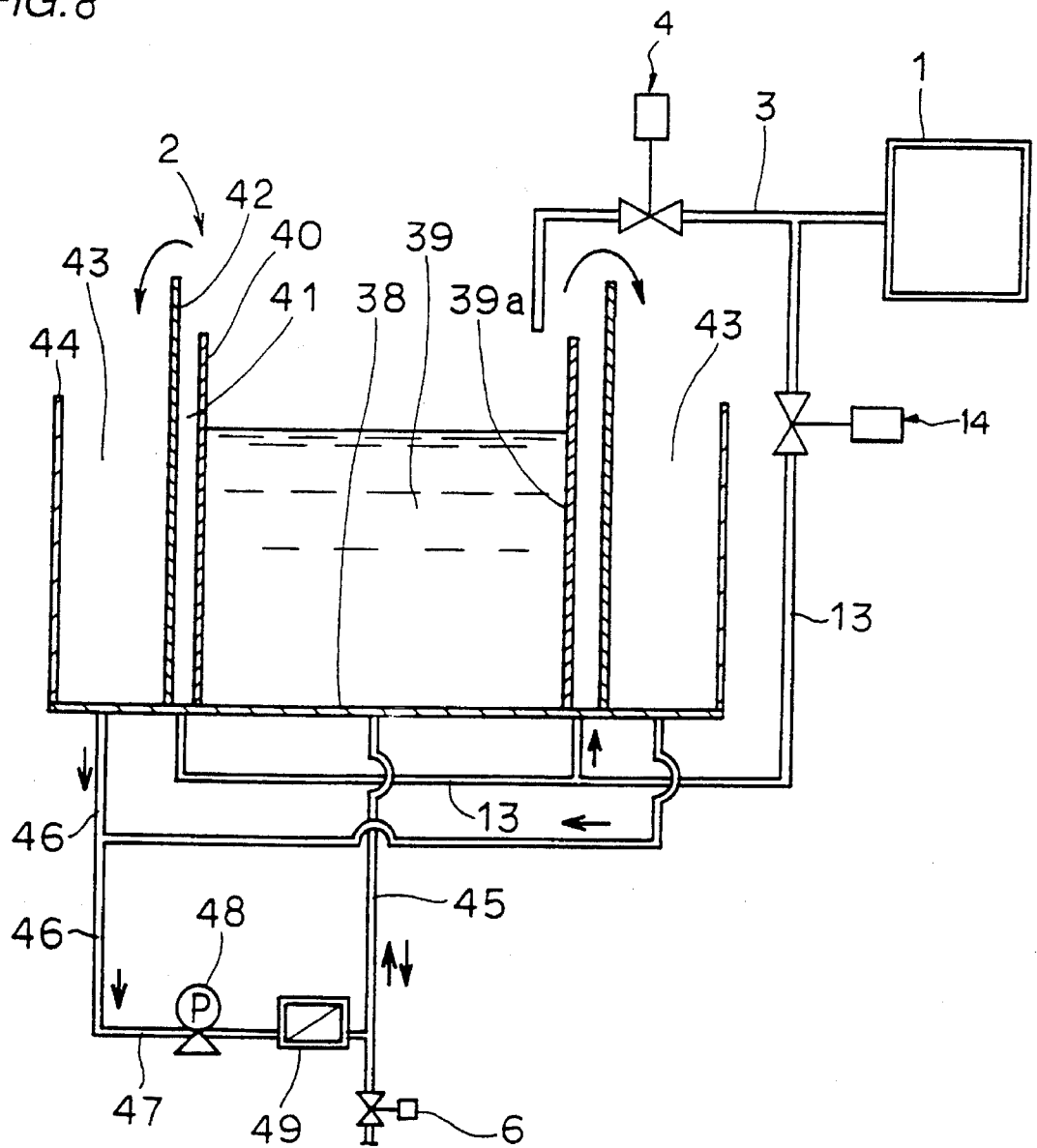
FIG. 8 is a view showing the concept of a cleaning apparatus according to a sixth embodiment of the invention.
Figure 9:
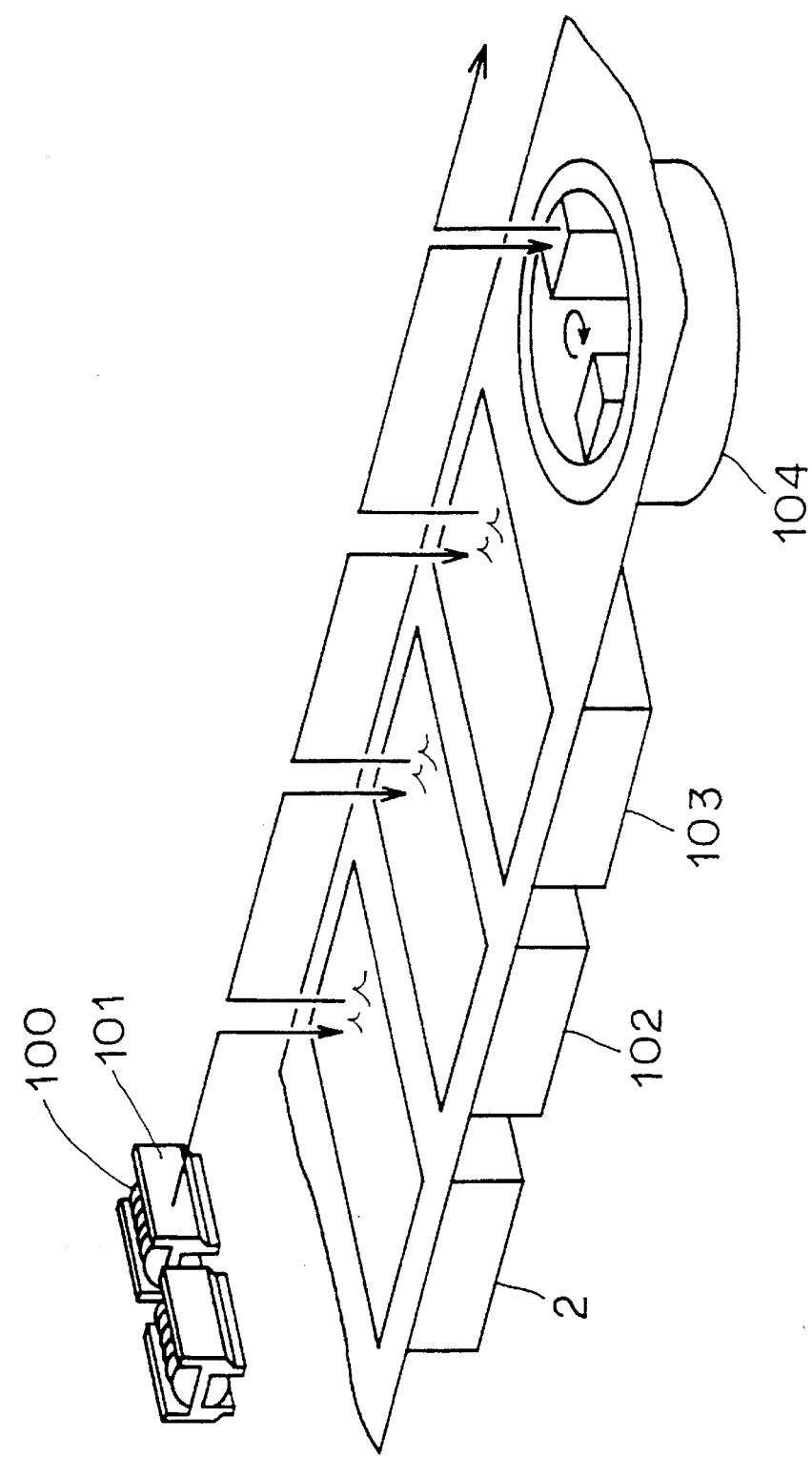
FIG. 9 is a perspective view showing a method of cleaning a surface-treated wafer.
Figure 10:
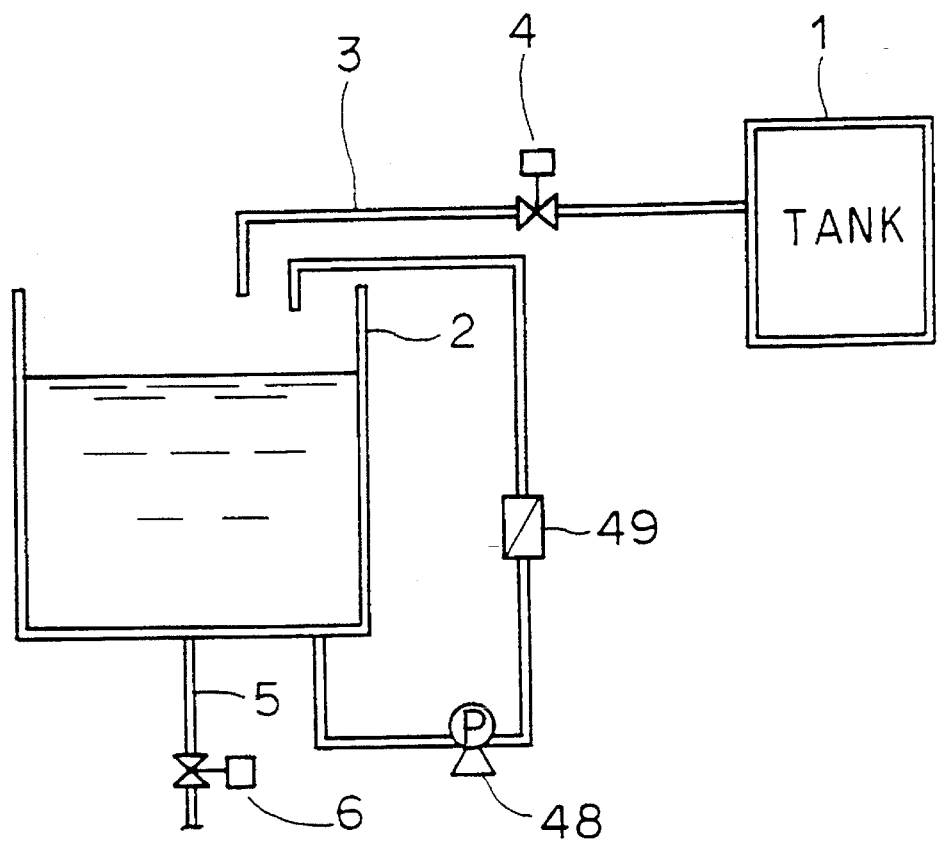
FIG. 10 is a view showing the concept of a conventional cleaning apparatus.
Figure 11:
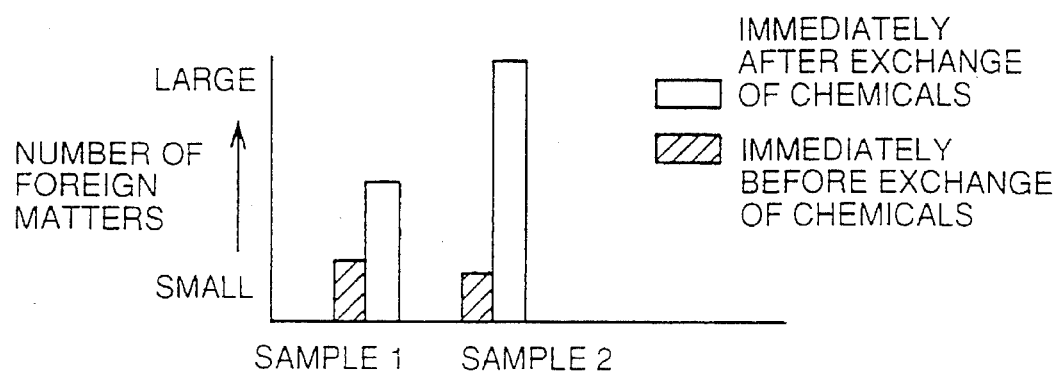
FIG. 11 is a graph showing the number of foreign matters about as large as 0.1 μm in size contained in cleaning chemicals immediately after and before exchanging cleaning chemicals.
Figure 12:
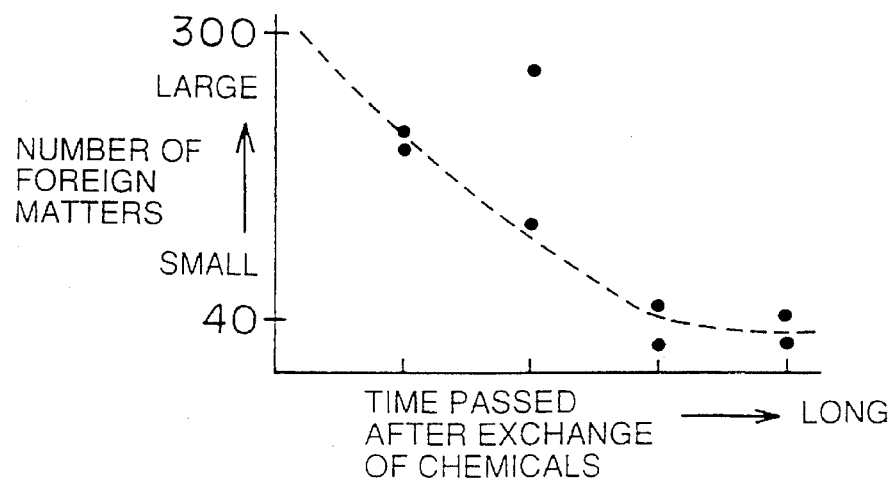
FIG. 12 is a chart showing the relation between time passed from exchange of the cleaning chemicals and the number of foreign matters about as large as 0.1 μm.

FIG. 8 is a view showing the concept of a cleaning apparatus according to EMBODIMENT 6. The cleaning apparatus according to EMBODIMENT 6 includes a cleaning chemicals tank 1 storing new cleaning chemicals, and a cleaning vessel 2 for accommodating the cleaning chemicals supplied from cleaning chemicals tank 1. Cleaning vessel 2 includes a bottom wall member 38, and a first tubular surrounding member 40 provided on bottom wall member 38 and extending upwardly to form a cleaning chamber 39 for accommodating cleaning chemicals. Provided on bottom wall member 38 is a second tubular surrounding member 42 extending upwardly and surrounding first tubular surrounding member 40 from the outside at a distance apart to define a first space 41. The volume occupied by first space 41 is very small.

Provided on bottom wall member 38 is a third tubular surrounding member 44 extending upwardly and surrounding second surrounding member 42 from the outside at a distance apart to define a second space 43 (hereinafter referred to as overflow vessel 43). The height of second surrounding member 42 is set higher than the height of first surrounding member 40.

Cleaning chemicals tank 1 is coupled to a first cleaning chemicals supply conduit 3 supplying cleaning chemicals into cleaning container 8. A second cleaning chemicals supply conduit 13 supplying cleaning chemicals up from the bottom into first space 41 is connected to bottom wall member 38. Bottom wall member 38 is further connected to a first waste fluid conduit 45 for discharging used cleaning chemicals from cleaning chamber 39. A second waste fluid conduit 46 for discharging cleaning chemicals from second space 43 is connected to bottom wall member 38. First waste fluid conduit 45 and second waste fluid conduit 46 are connected by a connection conduit 47. Connection conduit 47 is provided with a circulation pump 48 circulating cleaning chemicals between first waste fluid conduit 45, cleaning chamber 39, overflow vessel 43 and second waste fluid conduit 46. Connection conduit 47 is provided with filter means 49 for filtering the circulating fluid through connection conduit 47 to remove foreign matters therefrom.

Now, an operation of cleaning a wafer will be described. Waste fluid valve 6, first supply valve 4, and second supply valve 14 are closed. Cleaning chemicals continue to be supplied into cleaning chamber 39 through filter means 49 by the function of circulation pump 48. The cleaning chemicals partially flows into overflow vessel 43 from cleaning chamber 39, and circulates through second waste fluid conduit 46, connection conduit 47, and filter means 49. Particles in the cleaning chemicals is removed by filter means 49. A wafer is cleaned with the circulating cleaning chemicals.

Now, an operation of exchanging cleaning chemicals will be described. Waste fluid valve 6 for first waste fluid conduit 45 is opened. By gravity, used cleaning chemicals in overflow vessel 43 and cleaning chamber 39 is discharged. Simultaneously with or somewhat earlier than opening of waste fluid valve 6, second supply valve 14 for second cleaning chemicals supply conduit 13 is opened. When second supply valve 14 is opened and new cleaning chemicals continues to be supplied into space 41, cleaning chemicals overflows from space 41 in the meantime, flows along the internal surface 39a of cleaning chamber 39, and the new cleaning chemicals starts cleaning inner wall surface 39a. When the used cleaning chemicals in cleaning chamber 39 is entirely discharged, waste fluid valve 6 is closed, first supply valve 4 is opened, and new cleaning chemicals is supplied into cleaning chamber 39. During the period, second supply valve 14 continues to be open, and the inner wall surface 39a of cleaning chamber 39 is maintained in a wetted state at the time of exchanging cleaning chemicals. When the new cleaning chemicals fills cleaning chamber 39, first supply valve 4 and second supply valve 14 are closed, thus completing exchange of the cleaning chemicals.

As in the foregoing, in the cleaning apparatus according to the first aspect of the invention, since the wetting agent supply means wets the inner wall surface of the cleaning vessel with a wetting agent when cleaning chemicals is discharged into the waste fluid conduit, and therefore the inner wall surface of cleaning vessel does not dry at the time of exchanging cleaning chemicals. As a result, no foreign matter is produced from the inner wall surface of the cleaning vessel. Particles sticking to the inner surface of the cleaning vessel are also washed off. As a result, particles in cleaning chemicals immediately after the exchange can effectively be reduced.

In the cleaning apparatus according to the second aspect of the invention, excess cleaning chemicals after filling the first space overflows and wets the inner wall surface of the cleaning chamber at the time of exchanging cleaning chemicals. Accordingly, the inner wall surface of the cleaning chamber does not dry at the time of exchange of cleaning chemicals. Particles sticking to the inner wall surface of the cleaning chamber are also washed off. Consequently, particles contained in cleaning chemicals immediately after the exchange can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A cleaning apparatus for cleaning a semiconductor wafer by immersing the semiconductor wafer in cleaning chemicals contained in a cleaning container, comprising:

a cleaning container being made of teflon-based materials, for accommodating the cleaning chemicals;

a conduit for waste fluid provided on the bottom of said cleaning container for externally discharging the cleaning chemicals; and wetting agent supply means for supplying a wetting agent for wetting the inner wall surface of said cleaning container.

2. A cleaning apparatus as recited in claim 1, wherein said wetting agent supply means includes a plurality of through holes provided on the top of said cleaning container, a nozzle fitted in each of said plurality of through holes, and a wetting agent supply conduit for guiding the wetting agent to said nozzle.

3. A cleaning apparatus as recited in claim 2, further comprising heating means for heating said wetting agent supply conduit.

4. A cleaning apparatus as recited in claim 2, wherein said wetting agent supply conduit is connected to a ultra pure water supply conduit for supplying ultra pure water into said wetting agent supply conduit.

5. A cleaning apparatus as recited in claim 4, wherein a hydrogen peroxide supply conduit for supplying aqueous hydrogen peroxide into said wetting agent supply conduit is connected to said wetting agent supply conduit.

6. A cleaning apparatus as recited in claim 1, further comprising a buffer tank connected to said conduit.

7. A cleaning apparatus as recited in claim 1, wherein
said wetting agent supply means includes vapor supply means for supplying vapor of the wetting agent.

8. A cleaning apparatus for cleaning a semiconductor wafer with cleaning chemicals, comprising:

a cleaning container for accommodating the cleaning chemicals;

a conduit for waste fluid provided on the bottom of said cleaning container for externally discharging the cleaning chemicals;

wetting agent supply means for supplying a wetting agent for wetting the inner wall surface of said cleaning container;

a buffer tank connected to said conduit;

count means connected to said conduit, downstream of the buffer tank, for waste fluid for counting the number of particles in the waste fluid flowing in said conduit for waste fluid; and control means for controlling the amount of fluid flowing in said wetting agent supply means and said waste fluid conduit based on information obtained from said count means.

9. A cleaning apparatus for cleaning a semiconductor wafer with cleaning chemicals, comprising:

a cleaning container for accommodating the cleaning chemicals;

a conduit for waste fluid provided on the bottom of said cleaning container for externally discharging the cleaning chemicals;

wetting agent supply means for supplying a wetting agent for wetting the inner wall surface of said cleaning container;

count means connected to said conduit for waste fluid for counting the number of particles in the waste fluid flowing in said conduit for waste fluid;

control means for controlling the amount of fluid flowing in said wetting agent supply means and said waste fluid conduit based on information obtained from said count means; and bubble removal means provided between said conduit for waste fluid and said count means for removing bubbles in the fluid flowing in said conduit for waste fluid.

10. A cleaning apparatus as recited in claim 9, wherein
said conduit for waste fluid is branched into a first branch conduit for sending the cleaning chemicals to said bubble removal means and a second branch conduit for directly discharging the cleaning chemicals.

11. A cleaning apparatus for cleaning a semiconductor wafer with cleaning chemicals including a cleaning vessel for accommodating cleaning chemicals supplied from a cleaning chemicals tank, said cleaning vessel including,
(a) a bottom wall member,
(b) a first tubular surrounding member provided on said bottom wall member for forming an accommodation chamber for accommodating said cleaning chemicals
(c) a second tubular surrounding member provided on said bottom wall member and surrounding said first tubular surrounding member from the outside at a distance apart so as to form a first space, and
(d) a third tubular surrounding member provided on said bottom wall member and surrounding said second tubular surrounding member from the outside at a distance apart so as to form a second space,
(e) the height of said second tubular surrounding member being larger than the height of said first tubular surrounding member, said apparatus further including, a first cleaning chemicals supply conduit for supplying the cleaning chemicals into said accommodation chamber, a second cleaning chemicals supply conduit for supplying the cleaning chemicals to said first space up from the bottom, a first conduit for waste fluid provided at said bottom wall member for discharging the cleaning chemicals present in said accommodation chamber, and a second conduit for waste fluid connected to said bottom wall member for discharging the cleaning chemicals present in said second space.

12. A cleaning apparatus as recited in claim 11, further comprising:

a conduit for connection for connecting said first conduit for waste fluid and said second conduit for waste fluid;

circulation means provided at said conduit for connection for circulating the cleaning chemical between said first conduit for waste fluid, said accommodation chamber, said second space, and said second conduit for waste fluid; and filter means provided at said conduit for connection for filtering the circulation chemicals flowing in said conduit for connection and removing particles therein.

* * * * *